(12) United States Patent
Prather

(10) Patent No.: US 10,965,100 B2
(45) Date of Patent: Mar. 30, 2021

(54) TUNABLE OPTICAL PAIR SOURCE AND RELATED SYSTEMS AND METHODS

(71) Applicant: Phase Sensitive Innovations, Inc., Newark, DE (US)

(72) Inventor: Dennis Prather, Newark, DE (US)

(73) Assignee: Phase Sensitive Innovations, Inc., Newark, DE (US)

(*) Notice: Subject to any disclaimer, the term of this patent is extended or adjusted under 35 U.S.C. 154(b) by 0 days.

(21) Appl. No.: 16/847,417

(22) Filed: Apr. 13, 2020

(65) Prior Publication Data

US 2020/0328573 A1 Oct. 15, 2020

Related U.S. Application Data

(60) Provisional application No. 62/833,310, filed on Apr. 12, 2019.

(51) Int. Cl.
| | |
|---|---|
| *H01S 5/068* | (2006.01) |
| *H01S 5/062* | (2006.01) |
| *H04B 10/50* | (2013.01) |
| *H01S 5/40* | (2006.01) |

(52) U.S. Cl.
CPC .......... *H01S 5/068* (2013.01); *H01S 5/06226* (2013.01); *H01S 5/4006* (2013.01); *H01S 5/4012* (2013.01); *H04B 10/505* (2013.01)

(58) Field of Classification Search
None
See application file for complete search history.

(56) References Cited

U.S. PATENT DOCUMENTS

| | | | |
|---|---|---|---|
| 8,848,752 B2 | 9/2014 | Prather et al. | |
| 8,873,966 B1* | 10/2014 | Wach | H04B 10/40 398/138 |
| 9,525,489 B2 | 12/2016 | Schuetz et al. | |
| 9,614,280 B2 | 4/2017 | Shi et al. | |
| 2002/0048062 A1* | 4/2002 | Sakamoto | H04B 10/2569 398/30 |

(Continued)

OTHER PUBLICATIONS

Schneider et al., "Radiofrequency signal-generation system with over seven octaves of continuous tuning," Nature Photonics, published online Jan. 20, 2013 (www.nature.com/naturephotonics) pp. 1-5.

*Primary Examiner* — Darren E Wolf
(74) *Attorney, Agent, or Firm* — Muir Patent Law, PLLC

(57) ABSTRACT

Example embodiments disclose a tunable optical pair source (TOPS) configured to generate first and second output optical beams having respective first and second frequencies that are phase locked with each other. The TOPS may include a first laser, such as a tunable laser, configured to generate a first laser beam, a radio frequency (RF) oscillator configured to transmit an RF reference signal, a beam splitter in optical communication with the first laser, and an electro-optic modulator configured to modulate the second split beam with the RF reference signal to form a modulated beam having a first sideband comb comprising a plurality of harmonics. Additionally, the TOPS may include an optical filter configured to receive the modulated beam and output a filtered optical beam, and a second laser configured to generate a second laser beam at the second frequency, the second laser being configured to receive the filtered optical beam as a seed.

32 Claims, 4 Drawing Sheets

(56) References Cited

U.S. PATENT DOCUMENTS

| | | | |
|---|---|---|---|
| 2004/0208614 A1* | 10/2004 | Price | H04B 10/5053 398/152 |
| 2007/0269217 A1* | 11/2007 | Yu | H04B 10/40 398/137 |
| 2009/0067838 A1* | 3/2009 | Chen | H04N 7/22 398/58 |
| 2014/0270783 A1 | 9/2014 | Prather et al. | |
| 2015/0381276 A1* | 12/2015 | Saito | H04J 14/0256 398/34 |
| 2017/0373760 A1* | 12/2017 | Miki | H04B 10/27 |
| 2020/0153094 A1* | 5/2020 | Murakowski | H01Q 21/24 |

* cited by examiner

TUNABLE OPTICAL PAIR SOURCE AND RELATED SYSTEMS AND METHODS

CROSS-REFERENCE TO RELATED APPLICATION

This application claims priority to U.S. Provisional Patent Application No. 62/833,310 filed Apr. 12, 2019, the disclosure of which is hereby incorporated by reference in its entirety. This application also incorporates by reference the disclosure titled, "Radiofrequency signal-generation system with over seven octaves of continuous tuning," authored by Schneider et al., and published in Nature Photonics, online Jan. 20, 2013, which may provide background information such as exemplary details of structure and operation of corresponding elements of this new non-provisional application.

BACKGROUND

Wireless communications utilize a wide variety of RF frequencies, including S and C bands (2-6 GHz), Ku-band (12-18 GHz), etc. Next generation broadband wireless may utilize at higher RF frequencies. Schneider et al. discloses a photonic radiofrequency system where a single signal source that can generate carrier waves over a variety of RF frequency bands, without sacrificing spectral purity. In contrast, purely electrical solutions encounter obstacles to realizing such a widely tunable source, as challenges arise related to high conduction losses, parasitics and susceptibility to electromagnetic interference (EMI).

FIG. 1 is representative of the prior art system of Schneider et al. Modulation is provided by an electro-optic phase modulator driven by a low-frequency high-purity reference. Phase modulation by a pure sinusoidal reference signal yields a comb of sidebands offset from the reference by multiples (harmonics) of the reference. Additional nonlinear distortion is contributed by including an electronic element such as a saturated amplifier or a nonlinear transmission line, which yields a broader comb of sidebands. Injecting the entire comb of sidebands into a clone laser (Laser 2), after filtering to suppress the reference laser's (Laser 1) fundamental line, phase-locks the Laser 2 with Laser 1.

Wide tunability is realized by injection locking using a broad comb of harmonics, all derived from externally modulating reference Laser 1 with a low-frequency RF reference that has been subject to nonlinear distortion. The output of Laser 1 may be used as the optical carrier. Laser 2 is a clone laser that is tuned to match and lock to the frequency of any one of the injected harmonics and is used as a reference beam. When the outputs of Laser 1 and Laser 2 are combined, a combined optical signal is generated having a beat frequency equal to the offset (difference) between the frequencies of Laser 1 and Laser 2. Choosing higher harmonics allows very high offset frequencies to be obtained, and because the locked lasers have identical phase noise, the purity of the reference is preserved.

In the prior art system of FIG. 1, the primary laser (Laser 1) is fixed. Tunability of the system is achieved by generating and injecting a wide comb of sidebands into the clone laser (Laser 2) that are offset from Laser 1 (the primary laser) by harmonic multiples of a low-frequency tunable RF reference oscillator, and tuning the clone laser (Laser 2) to select one of the harmonics of the injected comb of sidebands. Specifically, prior to injection into the clone laser (Laser 2), the optical carrier is suppressed by an optical filter to reject the optical carrier while passing one entire sideband comb; or interferometrically, as by null biasing in a Mach-Zehnder Interferometer (MZI) type modulator (when the optical carrier is suppressed in a Mach-Zehnder Interferometer (MZI) type modulator, even harmonics are also suppressed along with the carrier, and both upper and lower sideband combs comprising odd harmonics are injected into the clone laser (Laser 2)). The resonance of the injected laser cavity of the clone laser (Laser 2) is thermally tuned to match a targeted and/or selected harmonic in the sideband comb injected into the clone laser (Laser 2). This technical setup leads the laser beam of the clone laser (Laser 2) to lock to that particular selected harmonic of several harmonics that are injected into the clone laser (Laser 2).

As noted, in the prior art system of FIG. 1, harmonics other than the selected harmonic in the comb are also injected into the clone laser (Laser 2). Although these non-selected harmonics are not resonantly amplified in the laser cavity of the clone laser (Laser 2), they are present in the output of the clone laser (Laser 2) as spurs. As a result, when the output of the clone laser (Laser 2) is combined with the reference laser (Laser 1), the non-desired harmonics beat in conjunction with the output of the reference laser (Laser 1) output on the photodiode detector which leads to a particular problem of generating undesired spurious RF output harmonics.

SUMMARY

Exemplary embodiments may disclose a tunable optical pair source (TOPS) configured to generate first and second output optical beams having respective first and second frequencies that are phase locked with each other. The TOPS may include, a tunable laser configured to generate a first laser beam at the first frequency, the first frequency being variable, and a radio frequency (RF) oscillator configured to transmit an RF reference signal oscillating at a radio frequency. The TOPS may further include, a beam splitter in optical communication with the tunable laser and configured to split the first laser beam and transmit corresponding first and second split beams, a first optical path in optical communication with the beam splitter to receive the first split beam and to provide the first output optical beam, and a second optical path in optical communication with the beam splitter to receive the second split beam and to provide the second output optical beam. The second optical path may include, an electro-optic modulator configured to modulate the second split beam with the RF reference signal to form a modulated beam having a first sideband comb comprising a plurality of harmonics, an optical filter configured to receive the modulated beam and output a filtered optical beam, and a fixed laser configured to generate a second laser beam at the second frequency, the fixed laser being configured to receive the filtered optical beam as a seed. In the disclosed TOPS, the first frequency and the second frequency may be offset by an integer multiple of the RF frequency, and the second frequency may fall within the passband of the optical filter.

In some embodiments, the TOPS may further include an optical circulator having first, second, and third ports. The optical circulator may be configured to receive the filtered optical beam at the first port and pass the filtered optical beam via the second port to the fixed laser, and receive the second laser beam at the second port and pass the second laser beam via the third port to an output of the TOPS. In some embodiments, a TOPS system, such as an antenna (e.g., phased array antenna) may be formed of a TOPS, a combiner that combines the outputs of the TOPS into a combined beam, a third optical path extending from the combiner to a photodetector that is configured to detect the combined beam.

Exemplary embodiments may disclose a method of generating first and second output optical beams having respective first and second frequencies that are phase locked with each other. Exemplary methods may include generating a first laser beam at the first frequency, the first frequency being variable, and transmitting an RF reference signal oscillating at a radio frequency. Exemplary methods may further include, splitting the first laser beam and transmitting corresponding first and second split beams, and receiving the first split beam and providing the first output optical beam in a first optical path. Exemplary methods may further include, receiving the second split beam and providing the second output optical beam in a second optical path, and modulating the second split beam with the RF reference signal to form a modulated beam having a first sideband comb comprising a plurality of harmonics. Exemplary methods may further include, receiving the modulated beam at an optical filter and outputting a filtered optical beam, and receiving the filtered optical beam as a seed and generating a second laser beam at the second frequency. In exemplary methods, the first frequency and the second frequency may be offset by an integer multiple of the RF frequency, and the second frequency may fall within a passband of the optical filter. In some exemplary methods, combining the first optical beam and the second optical beam to thereby form a combined beam, and detecting the combined beam may additionally be performed.

BRIEF DESCRIPTION OF THE DRAWINGS

The present disclosure will now be described more fully with reference to the accompanying drawings, in which various embodiments are shown. The invention may, however, be embodied in many different forms and should not be construed as limited to the exemplary embodiments. Like numbers refer to like elements throughout the drawings, which include the following.

DETAILED DESCRIPTION OF THE EMBODIMENTS

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept disclosure and claims. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art of this disclosure. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
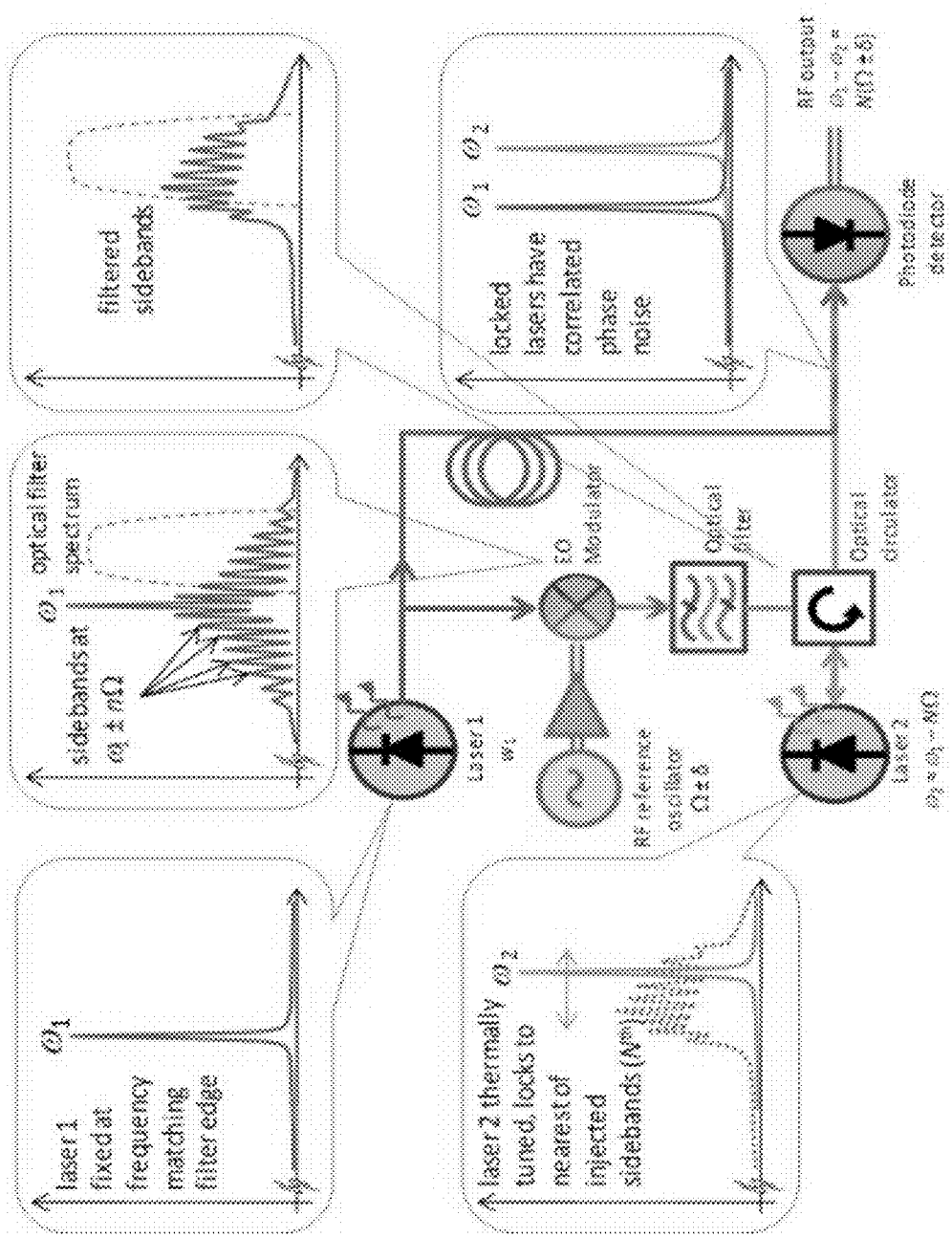
FIG. 1 is an illustration of a prior art device.
Figure 2:
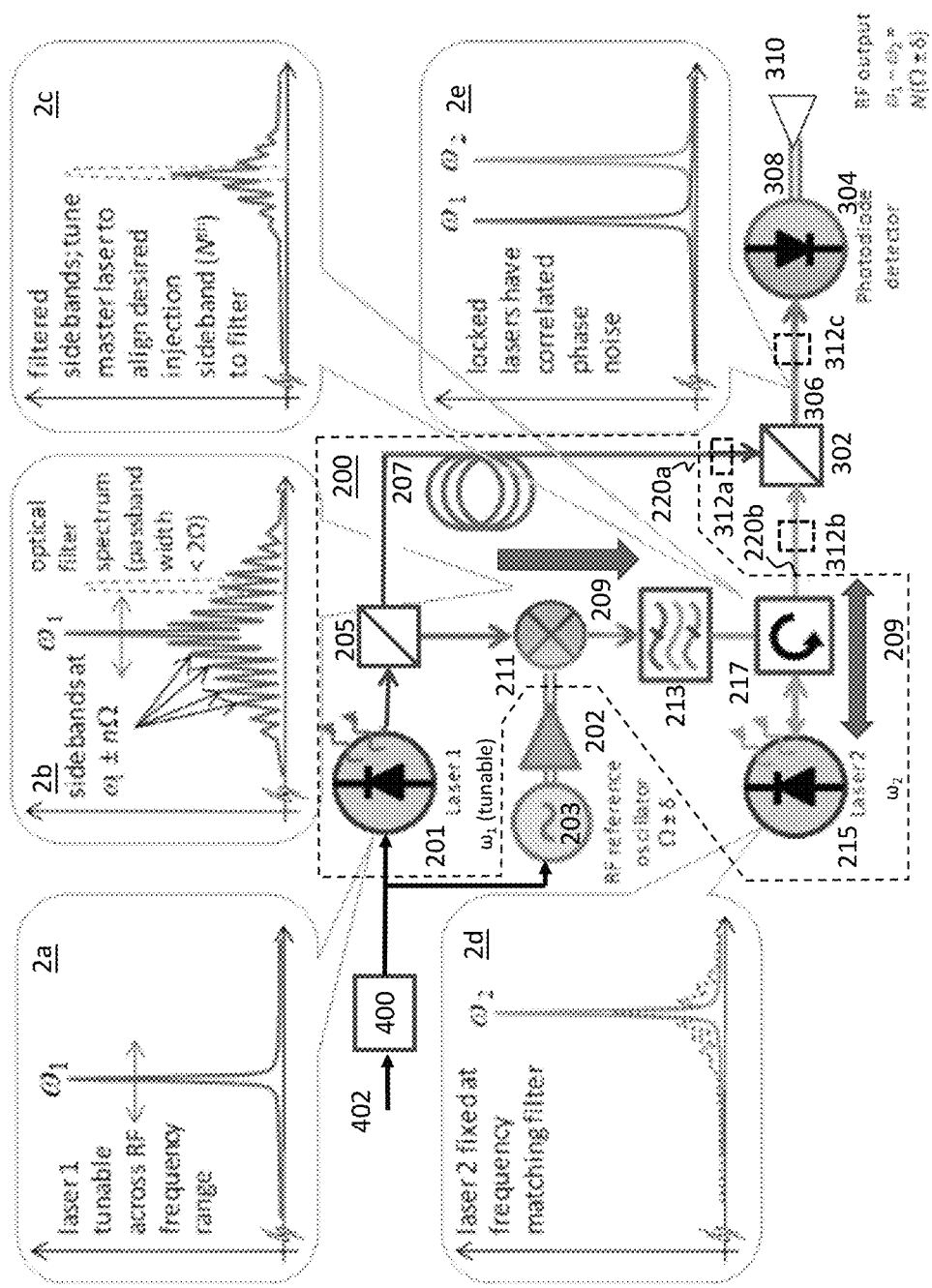
FIG. 2 is a schematic diagram of an exemplary embodiment.

FIG. 2 illustrates an improved system which may address one or more of the technical problems discussed above with respect to prior art systems. A notable difference between the prior art systems and the present disclosure is that the primary laser (or reference laser) 201 is tunable across a range of frequencies. The secondary laser (or clone laser) which is injected with a seed resulting from modulation of the laser beam output by the tunable laser 201 may be implemented as a fixed laser 215 (although a tunable laser may also be used here). Selection of a harmonic for seed injection to the secondary laser 215 may be performed without requiring tuning of the secondary laser 215. For example, selection of the harmonic (and frequency of the secondary laser beam) may be performed by use of a narrow pass-band optical filter 213 having a passband sufficient to encompass only a single harmonic sideband from the input sideband comb (and exclude or suppress others). The optical filter passband is matched to the frequency of the fixed laser 215.

When including an optical filter 213 that has a very narrow passband, the TOPS may efficiently attenuate unwanted harmonics and leave only one harmonic at significant enough signal strength for injection seeding to the fixed laser 215. The secondary laser thus may automatically lock to the harmonic selected by the optical filter without requiring tuning to select between one of many harmonics. Reducing the number of injected harmonics improves the operation of the fixed laser 215 as it locks better to the selected injected wavelength, which reduces instabilities and phase noise. Similarly, an optical filter 213 that is fixed has generally better filtering characteristics (is more selective) as compared to a conventional tunable filter. However, it should be understood that tunable optical filters may certainly be used in place of a fixed filter. However, a fixed filter may have certain advantages as, generally, it (1) reduces the complexity of the system and (2) provides improved performance compared to a tunable filter. However, those with skill in the art will appreciate that having a tunability of the optical filter may be desired in some configurations. For example, a tunable optical filter may be desired to allow slightly adjusting the center of the passband to better match the frequency to the free oscillations of the secondary laser (e.g., fixed laser 215) while still having the bulk of the advantages of a fixed filter (e.g., by virtue of only being limited in its tunability over a narrow range).

FIG. 2 illustrates and exemplary embodiment of the present invention. A tunable optical pair source (TOPS) 200 is configured to generate and output at outputs 220a and 220b first and second output optical beams having respective first and second frequencies ($\omega_1$ and $\omega_2$) that are phase locked with each other is shown. The TOPS 200 includes a tunable laser 201 and a fixed laser 215. The tunable laser 201 is configured to generate a first laser beam at the first frequency $\omega_1$ (represented by spectrum 2a in FIG. 2) where the first frequency $\omega_1$ is adjustable. For example, the tunable laser 201 may be thermally tuned or adjusted by a user from an external control to emit the first laser beam of a selected and/or adjustable frequency. Additionally, after selection of the first frequency $\omega_1$, the tunable laser 201 may operate to generate the first laser beam at the selected first frequency $\omega_1$ in a substantially constant manner (i.e., so that the frequency of the first laser beam remains substantially constant, such as with acceptable variations in frequency due to noise). In later, a subsequent operation, the tunable laser 201 may have the first frequency $\omega_1$ adjusted to a frequency different from its previous operation. Additionally, the tunable laser 201 may be tunable across the RF frequency range of the RF signals input into EO modulator 211. Thus, the frequency of the tunable laser may be adjusted in the higher frequency optical domain over a range corresponding to this RF frequency range. In some embodiments, a first frequency of the tunable laser 201 may be adjustable at least by an amount corresponding to a bandwidth of a first sideband comb (see FIG. 2).

In the TOPS 200, the first laser beam generated by tunable laser 201 is transmitted to a beam splitter 205. The beam splitter 205 may be in optical communication with the tunable laser by any known means, e.g., by an optical waveguide such as an optical fiber. The beam splitter 205 is configured to split the first laser beam originating from the tunable laser 201 to generate corresponding first and second split beams (each having the first frequency $\omega_1$). The first split beam is transmitted via a first optical path 207 to output 220a of the TOPS 200. The first optical path 207 may be formed by an optical waveguide, such as an optical fiber. Although not shown in FIG. 2, other optical elements may be provided within first optical path 207 (e.g., beam splitter, combiner, etc.) The second split beam provided by beam splitter 205 may be transmitted to an electro-optic modulator 211 via a second optical path 209. In this example, the second optical path 209 provides an optical communication path from beam splitter 205 to output 220b of the TOPS 200. The output 220b of the TOPS 200 is in optical communication with beam splitter 205 via the second optical path 209 and provides a second output optical beam of frequency $\omega_2$ that is both phase locked with the first output optical beam and has a frequency $\omega_2$ that is offset from the first frequency $\omega_1$ by a set value. In this example, the second optical path 209 provides optical communication from the beam splitter 205 to output 220b and extends through the following elements in the following sequence: from beam splitter 205, to electro-optic modulator 211, to optical filter 213, to optical circulator 217, to fixed laser 215, back to the optical circulator 217 and to output 220b of the TOPS 200. In addition, the second optical path 209 includes optical waveguides, such as optical fiber, connecting these optical elements to provide the various optical signals therebetween. It will be appreciated that the single lines extending between the elements shown in FIG. 2 represent optical waveguides (with arrow heads denoting a direction of transmission), while the double lines extending between the elements shown in FIG. 2 represent RF waveguides (e.g., coaxial cable, strip lines, microstrips, twisted pair, etc.) or other electrical wiring.

The TOPS 200 may be provided with a comb of harmonics provided from a radio frequency (RF) oscillator 203 and amplifier 202. RF oscillator 203 is configured to generate an electrical RF reference signal oscillating at a radio frequency. For example, the oscillator 203 may generate an RF reference signal having a frequency within the range of several kHz to tens of GHz, such as between 30 kHz to 100 GHz or more. The RF oscillator 203 may be a voltage controlled oscillator and have a voltage input to adjust the frequency of the RF reference signal generated by the RF oscillator 203. The frequency of the RF reference signal generated by the RF reference oscillator may be altered, such as being selectable by a user (e.g., via programming) or otherwise automatically determined.

The RF reference signal generated by the RF oscillator 203 is provided to an amplifier 202. The amplifier 202 may be a saturated RF amplifier and generate a comb of RF harmonics from the RF reference signal provided by the RF reference oscillator 203. The comb of RF harmonics may comprise an electrical signal having plurality of harmonics (or RF tones) at frequencies equal to a corresponding integer multiple of the RF reference signal provided by the RF oscillator 203. For example, when the RF reference signal provided by RF reference oscillator 203 has a frequency of $\Omega$, the comb of RF harmonics may have RF harmonics (tones) at frequencies of $\Omega$, $2*\Omega$, $3*\Omega$, $n*\Omega$ (where n is a positive integer). Electronic circuitry other than an amplifier 202 may be used to generate the comb of RF harmonics, such as other electronic components, such as a nonlinear transmission line, or other electronic circuitry comprising a nonlinear element.

The comb of RF harmonics generated by the amplifier 202 is provided to an electro-optic modulator 211, e.g., a high-speed electro-optic (EO) modulator, or a Mach-Zehnder-Interferometer (MZI) modulator. The electro-optic modulator 211 modulates the second split beam (having a frequency of $\omega_1$) provided by beam splitter 205 with the comb of RF harmonics to generate a modulated beam comprising an optical signal having a center frequency of $\omega_1$ and first and second sideband combs of a plurality of harmonics (as represented in spectrum 2b of FIG. 2). Each sideband comb of this modulated beam corresponds to the comb of RF harmonics provided to the electro-optic modulator 211 as upconverted to an optical signal. Thus, the frequencies of the harmonics of the modulated beam output by the electro-optic modulator 211 are offset from $w_1$ by a corresponding integer multiple of $\Omega$, (or an integer multiple of the frequency of the RF reference signal generated by RF oscillator 203). Spectrum 2b of FIG. 2 shows teeth of the sideband combs of the modulated beam representing corresponding harmonics in the optical realm at locations of $\omega_1+/-n*\Omega$ (where n is an integer). It should be appreciated that generation of a comb of harmonics (at both the RF frequencies and corresponding optical frequencies) is not necessary. For example, the RF reference signal provided by the RF reference oscillator 203 may be provided directly to the electro-optic modulator 211 as a single RF harmonic resulting in sidebands of the modulating beam each having a single harmonic. It should be understood, unless context indicates otherwise, that the description of various systems and methods herein also applies to such single harmonic implementation.

The modulated beam generated by electro-optic modulator 211 is transmitted along the second optical path 209 to an optical filter 213. The optical filter 213 receives and filters the modulated beam and outputs a filtered optical beam along the second optical path 209. The dashed line in spectrum 2b illustrates an exemplary passband (encompassing frequency $\omega_2$) of the optical filter 213, which when applied to the spectrum 2b via optical filter 213 results in exemplary spectrum 2c of FIG. 2 (which represents the output of optical filter 213). The optical filter 213 may have a very narrow passband that includes and/or is centered upon the operational frequency of fixed laser 215. The optical filter may have passband width of less than $2*\Omega$ and to encompass only a single harmonic of the modulated beam (with other harmonics outside the passband) and thereby suppress and/or eliminate the remaining harmonics of the modulated beam. For example, the RF oscillator 203 may be configured to generate an RF reference signal of a frequency (a) 2.4 GHz, (b) 5 GHz, (c) 28 GHz, (d) 37 GHz, (e) 39 GHz and/or with RF frequencies in the ranges of (f) 27.5-28.35 GHz, (g) 37-40 GHz and (h) 64-71 GHz. For cases (a) to (h), the optical filter 213 may have a passband width of (a) less than 4.8 GHz, (b) less than 10 GHz, (c) less than 56 GHz, (d) less than 74 GHz, (e) less than 78 GHz (f) less than 55 GHz, (g) less than 74 GHz and (h) less than 128 GHz, respectively. For example, the optical filter 213 may have a passband of less than 6 GHz, such as less than 5 GHz. Additionally, in some embodiments the suppression of the remaining harmonics (other than the passed single harmonic) of the modulated beam may be attenuated by at least 3 dB. For example, the optical filter 213 may have a passband of 5 GHz or less (where the outer range of the passband corresponds to a 3 dB attenuation as compared to maximum power transmission) where out of band suppression is at least 20 dB, such as at least 30 dB (where such suppression is reached at an offset of approximately 10 GHz from the center of the filter passband). When the passband of the optical filter 213 encompasses only a single harmonic, the optical filter 213 may be responsive to identify (select) the harmonic to be resonated by laser 215, thereby not necessitating laser 215 to filter and select between several harmonics as the resonant frequency of laser 215. As the laser 215 may be relieved of this filtering role, laser 215 may be implemented to provide a wider locking range, which may improve the overall phase-noise performance of the system.

As described herein, the filter 213 may select a different one of the harmonics of the modulated beam by adjusting the frequency of the tunable laser 201, thus shifting the center frequency ($\omega_1$) of the modulated beam along with the sideband combs (and thus shifting each of the harmonics of the sideband combs). Also, the frequency $\Omega$ of the RF reference oscillator 203 may be adjusted to maintain a particular tooth of the comb in the passband of filter 213 as the center frequency $\omega_1$ of tunable laser 201 is shifted. Additionally, in some embodiments, a width of the passband of the filter 213 may be greater than $2*\Omega$ but less than a bandwidth of the first sideband comb of the modulated beam.

Use of a fixed optical filter for optical filter 213 may be preferred in certain implementations as a fixed optical filter may provide better filtering characteristics (e.g., be more selective) than a tunable optical filter. A fixed optical filter may also reduce the complexity of the TOPS providing a more economic and robust configuration. The filter 213 may be implemented as a Fiber Bragg Grating filter, a dielectric stack filter, an interferometric filter, such as a Fabry-Perot interferometer (or etalon) or Mach-Zehnder interferometer (or etalon) with a differential path length, an optical ring resonator (or ring cavity), an optical filter having a photonic-crystal. In some examples a conventional DWDM filter/multiplexer may be used. Filter 213 may be implemented as one of these optical filters or several of these optical filters cascaded together. Alternatively, the optical filter 213 may be tunable. In some examples, the tunability may be less than $+/-\Omega$ or less than $+/-0.5*\Omega$ to align (shift closer to each other) the center of the passband with a center of the selected harmonic (within the passband) of the modulated beam. Tunability may be implemented by controlling the size of the optical filter 213, such as by expanding or contracting the optical filter 213 by controlling its temperature and/or applying a compressive or tensile force to the optical filter (e.g., via a piezoelectric transducer), or by changing the angle and/or shifting the position or orientation of a dielectric-stack filter.

The TOPS may include an optical circulator 217. In some embodiments, the optical circulator 217 may have first, second, and third ports. In the example of FIG. 2, a first port receives the filtered optical beam from the optical filter 213 and the second port transmits/passes the filtered optical beam to the fixed laser 215. The second port also receives the second laser beam from the fixed laser 215 and the third port transmits/passes the second laser beam of the fixed laser 215 to the second output 220b of the TOPS.

The TOPS may include a fixed laser 215 that is configured to generate a second laser beam at a second frequency ($\omega_2$) (as represented by spectrum 2d in FIG. 2). The second frequency ($\omega_2$) may fall within the passband of the optical filter 213. The fixed laser 215 may be an injection locked laser and produce an injection locked, or phase-locked, laser signal. The fixed laser 215 may be considered a clone laser with tunable laser 201 being considered the reference laser. The fixed laser 215 receives the filtered optical beam from optical filter 213 via optical circulator 217 and uses the same as a seed. For example, the fixed laser 215 may be seeded with the filtered optical beam.

In other examples, the fixed laser 215 may receive the filtered optical beam without use of an intervening circulator, such as (for example), as being directly coupled with rom the optical filter 213 with an optical waveguide, without other intervening optical components interpose on that portion of the second optical path. In this alternative implementation without circulator 217, a separate port into the secondary laser 215 may be used to receive and input the filtered optical beam for injection locking. Specifically, the laser cavity of fixed laser 215 may be structured so as to provide for coupling of light to and from the laser cavity at two separate ports. For example, a Fabry-Perot cavity may be used where a semi-transparent mirror is used at both ends of the cavity so that each end of the cavity may serve as a port. In this configuration, filtered optical beam from optical filter 213 may (the seed signal) may be injected through a first port and the second laser beam may be output from a second port of the laser cavity of fixed laser 215. Such a configuration may not need circulator 217 to separate the injected signal from the second laser beam output from fixed laser 215.

As represented in spectrum 2d, filtered optical beam received by the fixed laser 215 (represented by dashed lines) may include attenuated harmonics (attenuated by the optical filter 213 due to falling outside its passband) on either side of the harmonic selected by the optical filter 213 (at frequency $\omega_2$). These attenuated harmonics may be further filtered (attenuated), relative to the selected harmonic, as a result of the fixed laser 215 automatically locking on to the selected harmonic (at frequency $\omega_2$) in generating the second laser beam (at frequency $\omega_2$). The first frequency $\omega_1$ of the tunable laser 201 and the second frequency $\omega_2$ of the fixed laser 215 are offset from one another by an integer multiple of the RF frequency $\Omega$.

Additionally, the tunable laser 201 may be tuned to shift a desired harmonic of the modulated beam to a frequency range within the passband of filter 213. Tuning laser 201 in this way may be used to select the desired integer multiple of the RF frequency $\Omega$ by which the frequencies of the first and second output optical beams are offset. It will be apparent that tuning laser 201 to shift the first frequency $\omega_1$ of the tunable laser 201 causes a shift in the frequency (also $\omega_1$) of the first output optical beam as well as a shift of the sideband combs of the modulated signal (i.e., all of the spectrum 2b is shifted). However, when the optical filter remains substantially fixed (e.g., the dashed line in spectrum 2b representing optical filter 213 passband is not shifted), a new harmonic (a new sideband tooth) of the modulated signal is eventually shifted into the passband of optical filter 213 to be selected by optical filter 213. Thus, the frequency $\omega_2$ of the second laser beam generated by fixed laser 215 may correspond to the frequency of a different harmonic of the modulated signal (but remaining in the range of the passband of the optical filter 213). As each harmonic of the modulated signal is offset from the center frequency $\omega_1$ of the modulated signal by a corresponding integer multiple of the RF reference frequency of $\Omega$ (the frequency of each harmonic=$\omega_1+/-n*\Omega$), tuning the tunable laser 201 in this way may be used to select this integer multiple of the RF reference frequency of $\Omega$ (i.e., select the value of the integer "n" in $\omega_2=\omega_1+/-n*\Omega$), The resonant operational frequency of the fixed laser 215 may be aligned with the center frequency of the passband of the optical filter 213 or otherwise match the optical filter 213 to fall within the passband of the optical filter 213.

It should be appreciated that the frequency of the second laser beam of laser 215 may vary (to align with the frequency of the selected harmonic) even when the second laser beam is generated by a fixed laser and not generated by a tunable laser. As used herein, a tunable laser 201 may refer to a laser designed so that the wavelength of light it generates may be changed, or tuned, over a certain range. In the case of semiconductor lasers, the tuning may be achieved by a controller (e.g., computer) that controls a change in the temperature at which the laser operates via the use of a thermo-electric cooler or a heater, and/or that controls a change in the injection current of the laser. When designing a system with a tunable laser, e.g., tunable laser 201, provisions may be made for varying the temperature or injection current, or both. In contrast, for a fixed laser, e.g., fixed laser 215, care may be taken in designing the circuitry powering it and environmental control to keep them stable so as to avoid unintentional change in the operating wavelength. For example, a fixed laser may have a control system (e.g., a controller, such as a computer) to maintain a substantially constant injection current and/or substantially constant temperature of the fixed laser. Both the fixed laser 215 and the tunable laser 201 may be implemented using similar, or identical, semiconductor chips. Power control circuitry and environment control circuitry surrounding the chip or chips, in which the resonant cavity of laser is formed determines whether such a laser constitutes a fixed laser or tunable laser. Generally, a fixed laser, e.g., laser 215 may include a stable power supply and a stable environment whereas for a tunable laser, e.g., tunable laser 201 may include a power supply and/or environment that are controlled to be altered. Thus, it should be appreciated that a fixed laser may have frequency that is not perfectly fixed. A fixed laser has a finite linewidth, indicating how much its frequency tends to vary even when there is no intentional variation of its inputs/operating conditions. Thus, laser 215 may be considered fixed by virtue of the absence of power control circuitry and environmental control circuitry configured to alter the operating frequency from a first target (i.e., selectable) operating frequency to a second target operating frequency in response to some direction (e.g. user input and/or programming) of the overall system operation.

In some embodiments, the fixed laser 215 may be substantially fixed during operation. However, the fixed laser 215 is phased locked with a harmonic offset from the frequency of the laser beam of the tunable laser 201. Thus, changes to first laser beam of the tunable laser 201, whether intentional or unintentional (i.e., noise), whether in phase or frequency, are correspondingly reproduced in the second laser beam of the fixed laser 215.

The TOPS 200 may be implemented in a variety of TOPS systems, such as a variety of wireless communication systems. FIG. 2 also illustrates an exemplary TOPS system, including the TOPS 200, a combiner 302, a photodetector 304, an antenna 310 and one or more electro-optic modulators 312 that may be used with the TOPS 200. U.S. patent application Ser. No. 16/198,652, filed Nov. 21, 2018, (hereby incorporated by reference in its entirety) provides exemplary details of the structure and operation of the elements of such a TOPS system, as well as exemplary details of the structure and operation of other TOPS systems that may be implemented with the improved TOPS of the present invention. For example, modulation of the one or more electro-optic modulators 312 may be used to encode information to provide the same as part of the combined optical beam (e.g., by phase and/or amplitude modulation of one or more of the first and second output optical beams) according to a variety of encoding schemes, such as OFDM, QAM, etc. The encoded information may be represented in corresponding phase and/or amplitude modulation of the beat RF signal and the RF electromagnetic wave output by antenna 310. The combiner 302 may be disposed where the first optical path 207 and the second optical path 209 converge, and may combine the output of the first optical path 207 (the first optical beam) and the output of the second optical path 209 (the second optical beam) to form a combined optical beam. The combined optical beam is transmitted via a third optical path 306 to photodetector 304. The third optical path may be embodied by an optical waveguide, such as an optical fiber. Spectrum 2e is representative of the combined optical beam, showing the combined optical beam comprising frequency components of $\omega_1$ and $\omega_2$ (corresponding to the contributions of the first and second output optical beams forming the combined optical beam).

One or more modulators 312 may be provided to phase and/or amplitude modulate one or both of the first and second output optical beams output by TOPS 200. FIG. 2 illustrates options for providing a modulator 312a in first optical path 207 to modulate the first output optical beam and/or a modulator 312b in the second optical path 209 to modulate the second output optical beam (prior to their being combined by combiner 302). After phase and/or amplitude modulating one or both of the first and second output optical beams with modulators 312a and/or 312b, the first and second optical beams may be combined by combiner 302 to interfere with each other in the combined optical beam.

Alternatively, modulation of a modulator 312c may be provided to receive the combined optical beam from combiner 302. In this configuration, the combiner 302 may combine the first and second output optical beams so that their polarization directions (linear or circular) are orthogonal to each other in the combined optical beam. Modulator 312c may be a vector modulator and phase and/or amplitude modulate one or both of the first and second output optical beams and alter the polarization direction of one or both of the first and second output optical beams so that they interfere with one another.

When the polarization direction of the combined first and second optical beams forming the combined optical beam are (at least partially) aligned and not orthogonal to each other (as provided by either the combiner 302 or modulator 312c), the first and second output optical beams may constructively and destructively interfere with each other. The combined optical beam may thus have a beat frequency of $|\omega_2-\omega_1|$, an RF frequency corresponding to an integer multiple of the RF reference frequency $\Omega$ (i.e., n*$\Omega$). Further, any modulation of the first and/or second output optical beams also is reflected in modulation of this RF beat signal. This modulation of the beat signal corresponds to the modulation, both in amplitude and phase, of the RF electromagnetic wave output by the corresponding antenna 310 (discussed below).

The photodetector 304 receives the combined optical beam to generate an RF electrical signal (a photocurrent) corresponding to the RF beat frequency of the combined optical beam. The photocurrent produced by photodetector 304 may faithfully regenerates an original input RF signal to the TOPS. The intrinsic noise components of the phases of lasers 201, 215 correlate to each other and may be identical or otherwise correlate to each other, and hence may not contribute to the time-varying component of the photocurrent, but may rather cancel out.

The RF electrical signal output of photodetector 304 may then drive or control antenna 310 to be transmitted as an electromagnetic wave. The RF electrical signal may be applied directly to antenna 310 (without an RF transmission line or an amplifier), or may be transmitted to antenna 310 via an RF transmission line 308 with optional amplification by an amplifier inserted in the RF path from the photodetector 304 to antenna 310 (amplifier not shown). In some examples, the RF signal output by the photodetector may be processed by a computer for data extraction and/or synthetization (e.g., after downconversion to baseband and digitization by an A/D converter). Owing to the superposition principle obeyed by the total electric field incident on the photodetector 304, the photocurrent (and hence the output RF signal) may be dependent on the phase difference of lasers' 201, 215 outputs and, consequently, the frequency of the photocurrent's oscillations proportional to (e.g., an integer multiple of) the RF-reference-signal frequency of the RF oscillator 203.

Additionally, the combined optical beam may have properties and/or attributes where the phase noise of the first optical beam and the phase noise of the second optical beam are correlated (see FIG. 2). The phase noise may be correlated as a result of the particular configurations described hereinabove and illustrated in FIG. 2. Consequently, optical contributions to phase noise in the RF output from the tunable laser 201 and from the fixed laser 215 are suppressed.

The TOPS system of FIG. 2 may also include a controller 400. The controller, like other controllers described herein, may be a computer, such as a general purpose computer or may be dedicated hardware or firmware (such as, for example, a digital signal processor (DSP) or a field-programmable gate array (FPGA)). The computer may be configured form several interconnected computers. The computer may be configured by software to perform/effect the relevant methods, functions and/or operations described herein. The controller 400 may provide control inputs to tunable laser 201 and RF oscillator 203 in a coordinated manner. The control inputs of controller 400 may be in the form of commands or may directly control the operation of tunable laser 201 and RF oscillator 203. The controller 400 may receive an input 402 which may select the RF carrier frequency to be generated by the TOPS system (where the RF carrier frequency may be the RF beat frequency of the combined optical signal described herein to control operation of antenna 310). Input 402 may be a user input which may be in the form of a configuration of switches, a configuration of a fuse set, a programmed EEPROM, a software program, etc.

For example, a desired frequency of the second laser beam may be $\omega_2$ (e.g., in this example, the desired frequency $\omega_2$ corresponding to a predetermined value correlating to the center of or otherwise within the passband of optical filter 213 (and corresponding to the operational frequency range of second fixed laser 215)). As described herein, to obtain the desired second laser beam frequency $\omega_2$ at a selected Nth harmonic to provide a desired RF beat frequency (and corresponding RF carrier frequency of the antenna 310) of N*$\Omega$ (where N*$\Omega=|\omega_2-\omega_1|$), the controller 400 may control (e.g., provide a command to) tunable laser 201 to generate an initial first laser beam frequency Wi and control (e.g., provide a command to) reference oscillator 203 to generate the RF reference signal with an RF frequency of $\Omega$. As noted herein, by virtue of the passband of optical filter 213 encompassing the Nth harmonic, the Nth harmonic of the sideband is passed to the fixed laser 215 to seed fixed laser to generate the second laser beam at a frequency of $\omega_2$. As described herein, the Nth harmonic has a frequency of $\omega_2=\omega_1+/-N*\Omega$, thus obtaining the desired RF beat frequency (and RF carrier frequency of antenna 310) of N*$\Omega$.

During a later operation, the desired RF beat frequency (and RF carrier frequency of antenna 310) may be altered by coordinating the control of the tuning of laser 201 and the RF frequency $\Omega$ of the reference signal of RF oscillator 203. Such a later operation may be a real-time alteration of the TOPS system to alter in real-time the RF beat frequency and RF carrier frequency of antenna 310, or the later operation may be a reconfiguration of the TOPS system for a different later implementation (e.g., with a different antenna or antenna array to operate at a different RF carrier frequency). For example, it may be desired to change the RF beat frequency of $|\omega_2-\omega_{1-1}|$ in an initial configuration of the TOPS system to an RF beat frequency of $|\omega_2-\omega_{1-2}|$ in a subsequent configuration. Assume an initial configuration of an RF beat frequency of $\omega_{1-1}$, with an RF frequency of RF oscillator 203 of $\Omega_1$ via selection of an Nth harmonic is obtained in a manner as described above. To achieve the desired subsequent configuration (with a subsequent RF beat frequency and RF carrier frequency of $|\omega_2-\omega_{1-2}|$), the controller 400 may controller may control (e.g., provide a command) tunable laser 201 to alter the frequency of the generated a first laser beam to $\omega_{1-2}$ while at the same time control RF oscillator 203 to alter the RF frequency of the RF reference signal to $\Omega_2$. The frequency of the second laser beam may be maintained at $\Omega_2$ or otherwise maintained within the passband of the optical filter 213 in both the first configuration and the second configuration of the TOPS system. As noted herein, in some embodiments, when the frequency of $\omega_1$ of the first laser beam is changed, the frequencies of comb of sidebands may change correspondingly and the optical filter 213 may select a new harmonic to pass to the fixed laser 215 (e.g., change selection of Nth harmonic in the first configuration to the (N+1)th harmonic in the second configuration). However, in this example, controller 400 may control the RF frequency $\Omega$ to be altered by $1/N^* \Delta \omega_1$ as a function of the change of $\omega_1$ (the frequency of the first laser) (where N is the integer number of the harmonic falling within with optical filter 213). Specifically, when $\omega_1$ is increased, the RF frequency $\Omega$ may be decreased by $1/N^* \Delta \omega_1$ and when $\omega_1$ is decreased, the RF frequency $\Omega$ may be increased by $1/N^* \Delta \omega_1$ thus maintaining the Nth harmonic at $\omega_2$ and within the passband of the optical filter 213, while changing (i.e., tuning) the frequency of the first laser beam of tunable laser 201 and thus the RF beat frequency of the combined beam and RF carrier frequency of antenna 310. In this example, changing the frequency of the first laser from $\omega_{1-1}$ to $\omega_{1-2}$ may be made while altering RF frequency of the RF reference signal from $\Omega_1$ to $\Omega_2$ where $\Omega_2=\Omega_1-1/N^*|\omega_{1-2}-\omega_{1-2}|$ (when $\omega_{1-2}>\omega_{1-1}$) or $\Omega_2=\Omega_1+1/N^*|\omega_{1-2}-\omega_{1-2}|$ (when $\omega_{1-2}<\omega_{1-1}$) and N is the Nth harmonic that is within the passband of optical filer 213. Although the above example has been made with respect to first and second configurations with respective first and second sets of frequencies, it will be appreciated that such coordinated alteration of the configuration of the TOPS system may be continuous and/or provided performed with respect to any number of configurations. However, if the RF beat frequency/RF carrier frequency are altered to a significant extent, it may be beneficial to also modify the antenna 310 (e.g., replace with a new antenna) to provide an operating frequency of the antenna 310 corresponding to the RF beat frequency.

Figure 3:
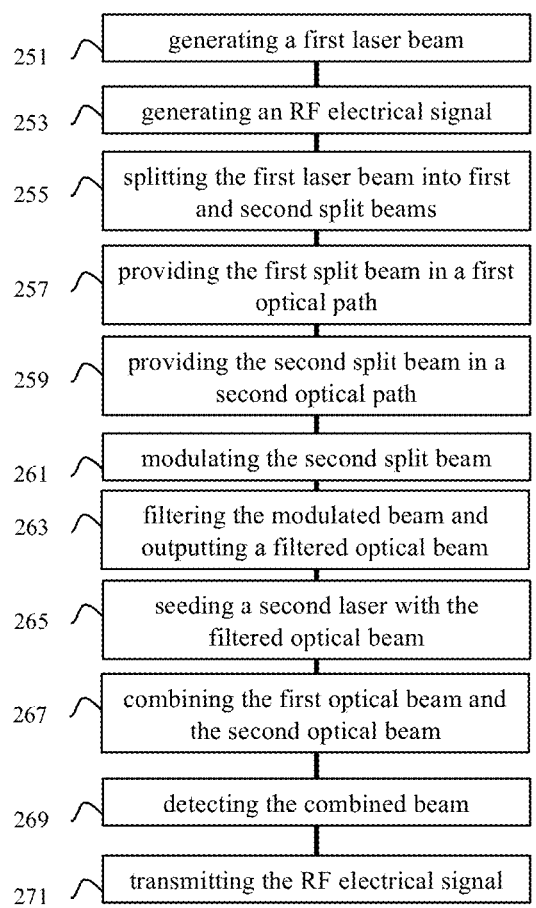
FIG. 3 is an exemplary method.

To maintain the frequency of the second laser beam at $\omega_2$ (e.g., to maintain at the center of or within the passband of the optical filter 213) in both the first and second configurations, controller 400 may control the frequency of the first laser beam to be is the frequency of the second laser beam of fixed laser 215, $\omega_{1-1}$ is an initial frequency of the first laser beam of laser 201, and $\omega_{1-2}$ is an adjusted frequency of the first laser beam. To maintain $\omega_2$ is the frequency of the second laser beam FIG. 3 is an exemplary method in accordance with the disclosure. The steps as illustrated in FIG. 3 may be implemented in conjunction with the TOPS 200 as disclosed herein with respect to FIG. 2. As illustrated in FIG. 3, a method of generating first and second output optical beams having respective first and second frequencies that are phase locked with each other is disclosed. Additionally, it shall be understood that certain steps disclosed here below may be performed simultaneously and/or continuously, although they will be explained sequentially for ease of explanation. Step 251 may include: generating a first laser beam at a first frequency, and the first frequency may be variable, e.g., by tunable laser 201. Step 253 may include: generating an RF reference signal oscillating at a radio frequency, e.g., by reference oscillator 203. Step 255 may include: splitting the first laser beam and transmitting corresponding first and second split beams, e.g., by beam splitter 205. Step 257 may include: transmitting the first split beam via a first optical path, e.g., first optical path 207. Step 259 may include: transmitting the second split beam via a second optical path, e.g. second optical path 209. Step 261 may include: modulating the second split beam with the RF reference signal or a comb of harmonics generated from the RF reference signal to form a modulated beam having first and second sideband combs comprising a plurality of harmonics, e.g., by modulator 211. Step 263 may include: filtering the modulated beam with an optical filter and outputting a filtered optical beam, e.g., by optical filter 213 which may be a fixed filter. Step 265 may include: providing the filtered optical beam as a seed to a fixed laser and generating a second laser beam at the second frequency, e.g., by fixed laser 215. The first frequency and the second frequency may be offset by an integer multiple of the RF frequency of the RF electrical signal, and the second frequency falls within the passband of the optical filter. The first split beam and the second laser beam may be output by the TOPS as first and second output optical beams, respectively.

Additional steps for optional use in conjunction with the disclosed steps above, may be disclosed below. Step 267 may include: combining the first output optical beam and the second output optical beam to thereby form a combined optical beam, e.g., by beam combiner 302. Step 269 may include: detecting the combined optical beam, e.g., by photodetector 304. The method may also include the sub-step comprising modulating at least one of: phase and amplitude of one or both of the first and second output optical beams prior to combining the same in step 267 or after combining in step 267 and prior to step 269. Step 271 may include: transmitting the RF reference signal, e.g., by antenna 310.

In some embodiments, step 263 may further include passing a single harmonic of the modulated beam and suppressing the remaining harmonics of the modulated beam. Furthermore, the first and second output optical beams may be mutually coherent.

As noted, tunable laser 201 acts as the primary or reference laser used to generate a seed signal, which injection-seeds the fixed laser 215. Use of a fixed laser 215 or other laser operating in a known or selected (e.g., programmable) range of frequencies allows for the inclusion of an optical filter 213 with a narrow passband, which may be narrow enough to encompass only a single harmonic sideband from the modulation-sideband comb. Thus, the passband of the optical filter and the frequency of the fixed laser 215 may be matched. For example, the passband of the optical filter may be matched to the resonant frequency of the fixed laser 215 and thus the passband of the optical filter may encompass the frequency of the beam generated by the fixed laser 215. When the optical filter is fixed, a simpler more robust system may result.

Optical beams originally generated by laser beams of the tunable laser 201 and the fixed laser 215 are then combined to form a combined beam having a beat frequency corresponding to the difference in frequencies of the beams output by tunable laser 201 and fixed laser 215, such beat frequency being an RF frequency corresponding to the RF reference oscillator (e.g., an integer multiple thereof, which should be understood to include the integer of 1). As tunable laser 201 is tunable and the frequency of fixed laser 215 may be fixed, adjusting the frequency of tunable laser 201 results in changing this difference in laser beam frequencies and thus changing the RF beat frequency formed by the combined beam. Specifically, adjusting the frequency of tunable laser 201 shifts the comb of harmonics so that the optical filter selects a different harmonic (although within the same passband frequency). Continuous tuning of the RF beat frequency may be achieved by concurrent adjusting the frequency of tunable laser 201 and the RF-reference-oscillator-203 frequency Ω so as to maintain one of the teeth in the comb of harmonics within the passband of filter 213 and within the locking range of fixed laser 215.

These modifications may provide improved harmonic spur suppression. For example, filtering the sideband comb output by electro-optic modulator 211 may be performed with a fixed optical filter. A fixed optical filter may thus provide a narrow and more precise passband as compared to the tunable filter. For example, Fiber Bragg Grating (FBG) filters may be implemented with passbands of 50 pm (6 GHz) wide. Such a narrow filter may thus be used to select a single harmonic for injection locking prior to injection to laser 215, thereby relieving the injected laser cavity (of laser 215) of its filtering role. Thus, tuning of the laser 215 to select one of several injected harmonics may be avoided, and the laser 215 may be implemented as a fixed laser.

Figure 4:
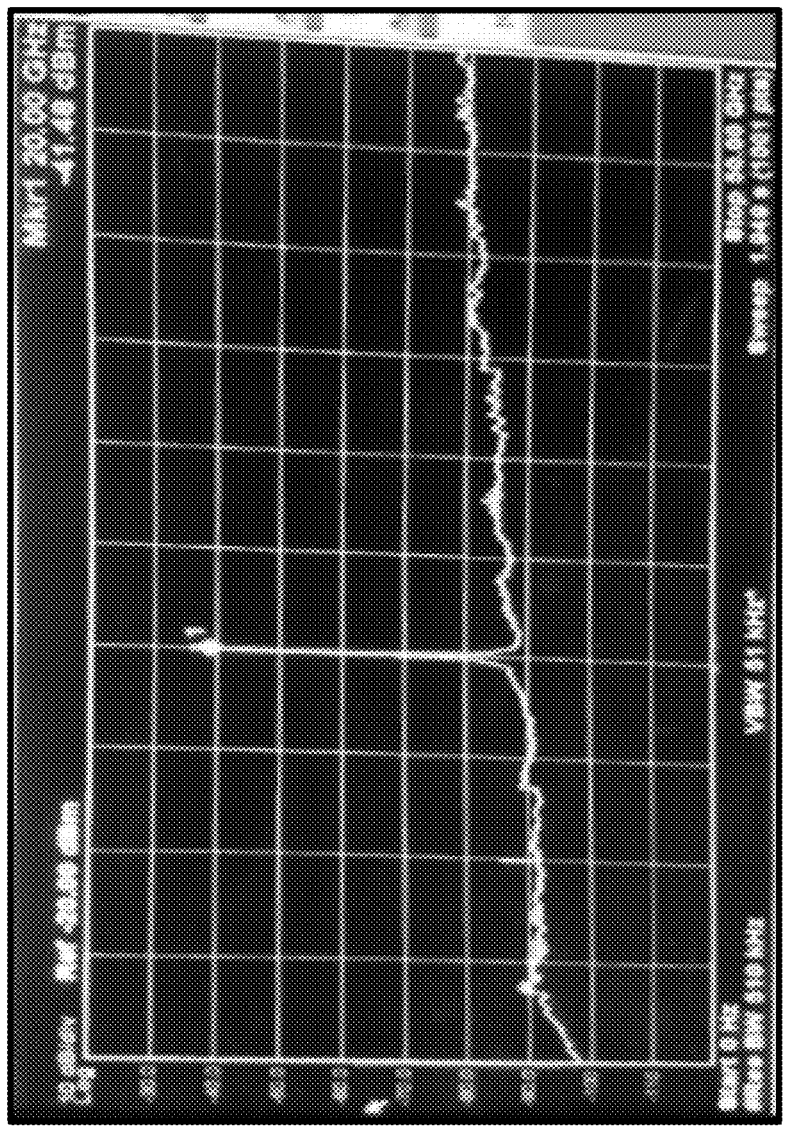
FIG. 4 is an exemplary graph illustrating some aspects of the improved results of the exemplary embodiment of FIG. 2.

The significant reduction of spurs in the output of this modified TOPS configuration can be seen in FIG. 4, illustrating the spectrum of the beat signal between the seed-injected laser 215 and the tunable laser 201 when implemented according to the inventive concepts described herein. As illustrated, the spurs of FIG. 4 are seen to be more than 40 dB below the output tone, close to the noise floor of the spectrum analyzer.

Additionally, the embodiment of FIG. 2 is capable of locking the laser beams produced by the tunable laser 201 and fixed laser 215 using modulation-sideband injection locking. Thus, the beams produced by the tunable laser 201 and fixed laser 215 are mutually coherent, such mutual coherence being maintained when combined and transmitted (e.g., in a wave guide/optical fiber) by combiner 302. Therefore, when the combined light beam is impinged on photodetector 304, e.g., a photodiode, the optical contributions to the phase noise (e.g., originating in the laser sources 201, 215) cancel each other out and a high quality RF signal that has a frequency of the beat frequency corresponding to an integer multiple of the RF reference oscillator is generated (see RF output in FIG. 2). As spurs in the second output optical signal generated by the seed injected laser (e.g., laser 215) are significantly suppressed/substantially eliminated, corresponding spurious beat frequencies in the combined optical beam and corresponding spurious RF frequencies in the RF signal produced by the photodetector 304 are similarly suppressed/avoided.

The foregoing is illustrative of exemplary embodiments and is not to be construed as limiting thereof. Although a few exemplary embodiments have been described, those skilled in the art will readily appreciate that many modifications are possible without materially departing from the novel teachings and advantages of the inventive concepts. Accordingly, all such modifications are intended to be included within the scope of the present invention as defined in the claims.

What is claimed is:

1. A tunable optical pair source (TOPS) apparatus configured to generate first and second output optical beams having respective first and second frequencies that are phase locked with each other, the TOPS apparatus comprising:
    a tunable first laser configured to generate a first laser beam at the first frequency, the first frequency being adjustable in response to tuning of the tunable first laser;
    a radio frequency (RF) oscillator configured to provide an RF reference signal oscillating at an RF frequency;
    a beam splitter in optical communication with the tunable first laser and configured to split the first laser beam and transmit corresponding first and second split beams;
    a first optical path in optical communication with the beam splitter to receive the first split beam and to provide the first output optical beam to a first output;
    a second optical path in optical communication with the beam splitter to receive the second split beam and to provide the second output optical beam to a second output,
    the second optical path comprising:
        an electro-optic modulator configured to modulate the second split beam in response to the RF reference signal to form a modulated beam having a first sideband;
        an optical filter configured to receive the modulated beam and output a filtered optical beam; and
        a second laser configured to generate a second laser beam at the second frequency, the second laser being configured to receive the filtered optical beam as a seed,
    wherein the first frequency and the second frequency are offset by an integer multiple of the RF frequency, and
    wherein the second frequency falls within a passband of the optical filter.

2. The TOPS apparatus of claim 1, further comprising:
    an optical circulator having first, second, and third ports; and
    wherein the optical circulator is configured to receive the filtered optical beam at the first port and pass the filtered optical beam via the second port to the second laser, and receive the second laser beam at the second port and pass the second laser beam via the third port to the second output.

3. The TOPS apparatus of claim 1, further comprising a combiner to combine the first output optical beam and the second output optical beam to thereby form a combined optical beam.

4. The TOPS apparatus of claim 3, further comprising a photodetector configured to detect the combined optical beam.

5. The TOPS apparatus of claim 4, further comprising a vector modulator configured to receive the combined optical beam and modulate at least one of: phase and amplitude of at least one of the first output optical beam and the second output optical beam of the combined optical beam.

6. The TOPS apparatus of claim 1, further comprising an amplifier configured to receive the RF reference signal and generate a RF comb of a plurality of RF harmonics,
    wherein the electro-optic modulator is configured to modulate the second split beam with the RF comb.

7. The TOPS apparatus of claim 1,
    wherein the first sideband comprise a first sideband comb comprising a plurality of harmonics,
    wherein the optical filter has a passband of a width that encompasses only a single harmonic of the first sideband comb of the modulated beam so as to attenuate the remaining harmonics of the first sideband comb of the modulated beam.

8. The TOPS apparatus of claim 7, wherein the remaining harmonics as provided with the second laser beam are no more than −20 dBc.

9. The TOPS apparatus of claim 7,
    wherein the second laser is an injection-locked laser, and
    wherein the optical filter provides the filtered optical beam to the second laser and the second laser is configured to automatically lock to the single harmonic without tuning.

10. The TOPS apparatus of claim 9, wherein the optical filter is a fixed optical filter having a passband matching an operational frequency of the second laser.

11. The TOPS apparatus of claim 7, wherein the first frequency of the tunable first laser is adjustable at least by an amount corresponding to a bandwidth of the first sideband comb.

12. The TOPS apparatus of claim 7, wherein the tunable first laser is configured to adjust the first frequency of the first laser beam so that the passband of the optical filter encompasses a second harmonic of the modulated beam that is different than the single harmonic.

13. The TOPS apparatus of claim 1, wherein a width of the passband of the optical filter is less than two times the RF frequency of the RF reference signal.

14. The TOPS apparatus of claim 1, wherein a width of the passband of the optical filter is 6 GHz or less.

15. The TOPS apparatus of claim 13, wherein the optical filter is a Fiber Bragg Grating filter.

16. The TOPS apparatus of claim 1, further comprising at least one additional electro-optic modulator configured to modulate at least one of: phase, amplitude, and frequency of the first output optical beam and/or the second output optical beam.

17. The TOPS apparatus of claim 3, wherein the combined optical beam has a beat frequency of the integer multiple of the RF frequency.

18. The TOPS apparatus of claim 17, further comprising:
a photodetector configured to detect the combined optical beam and generate an electrical signal having a frequency of the integer multiple of the RF frequency; and
an antenna in electrical communication with the photodetector to emit an electromagnetic wave at a frequency of the integer multiple of the RF frequency.

19. The TOPS apparatus of claim 18, further comprising at least one additional electro-optic modulator configured modulate at least one of: phase, amplitude, and frequency of the first output optical beam and/or the second output optical beam to encode information,
wherein the encoded information is provided with the electromagnetic wave emitted by the antenna.

20. The TOPS apparatus of claim 1, wherein the first and second output optical beams are mutually coherent.

21. The TOPS apparatus of claim 1, wherein phase noise of the second laser correlates to phase noise of the tunable first laser.

22. The TOPS apparatus of claim 1, wherein the optical filter is tunable.

23. A tunable optical pair source (TOPS) apparatus configured to generate first and second output optical beams having respective first and second frequencies that are phase locked with each other, the TOPS apparatus comprising:
a tunable first laser configured to generate a first laser beam at the first frequency, the first frequency being adjustable in response to tuning of the tunable first laser;
a radio frequency (RF) oscillator configured to generate an RF reference signal oscillating at an RF frequency;
a beam splitter in optical communication with the tunable first laser and configured to split the first laser beam and transmit corresponding first and second split beams;
a first optical path in optical communication with the beam splitter to receive the first split beam and to provide the first output optical beam to a first output;
a second optical path in optical communication with the beam splitter to receive the second split beam and to provide the second output optical beam to a second output,
the second optical path comprising:
an electro-optic modulator configured to modulate the second split beam in response to the RF reference signal to form a modulated beam having a first sideband comprising at least one harmonic;
a fixed optical filter configured to receive the modulated beam and output the harmonic of the first sideband as a filtered optical beam; and
a second laser configured to generate a second laser beam at the second frequency, the second laser being configured to receive the harmonic of the filtered optical beam as a seed; and
a controller in communication with the tunable first laser and the RF oscillator, the controller configured to alter the first frequency of the first laser generated by the tunable first later and to alter the RF frequency of the RF reference signal generated by the RF oscillator;
wherein the first frequency and the second frequency are offset by an integer multiple of the RF frequency, and
wherein the second frequency falls within a passband of the optical filter.

24. The TOPS apparatus of claim 23,
wherein the controller is configured to alter the first frequency of the first laser generated by the tunable first later and to alter the RF frequency of the RF reference signal generated by the RF oscillator in a coordinated manner so that the frequency of the harmonic of the first sideband remains within the passband of the optical filter.

25. The TOPS apparatus of claim 23, wherein the controller is configured to alter the first frequency of the first laser generated by the tunable first later and to alter the RF frequency of the RF reference signal generated by the RF oscillator in a coordinated manner to set the frequency of the harmonic of the first sideband to the center frequency of the passband of the optical filter.

26. The TOPS apparatus of claim 23, further comprising a combiner to combine the first output optical beam and the second output optical beam to thereby form a combined optical beam,
wherein the combined optical beam has a beat frequency of an integer multiple of the RF frequency, and
wherein the controller is configured to alter the first frequency of the first laser generated by the tunable first laser and to alter the RF frequency of the RF reference signal generated by the RF oscillator in a coordinated manner to alter the RF beat frequency of the combined signal while maintaining the frequency of the harmonic of the first sideband within the passband of the optical filter.

27. The TOPS apparatus of claim 26, wherein the controller is configured to alter the RF beat frequency of the combined signal in real time.

28. The TOPS apparatus of claim 23,
wherein the harmonic is the Nth harmonic of a plurality of harmonics of the first sideband, and
the controller is configured to maintain the Nth harmonic within the passband of the optical filter while altering the first frequency of the first laser generated by the tunable first later and the RF frequency of the RF reference signal generated by the RF oscillator in a coordinated manner.

29. The TOPS apparatus of claim 28, wherein the passband of the optical filter is no more than 6 GHz.

30. The TOPS apparatus of claim 23,
wherein the harmonic is the Nth harmonic of a plurality of harmonics of the first sideband where N is an integer, and
wherein, when the first frequency of the first laser generated by the tunable first laser is altered by $\Delta \omega_1$, the controller is configured to alter the RF frequency of the RF reference signal generated by the RF oscillator by $1/N^* \Delta \omega_1$.

31. The TOPS apparatus of claim 30, wherein the controller is configured to alter the first frequency of the first laser and to alter the RF frequency of the RF reference signal in real time.

32. A method of generating first and second output optical beams having respective first and second frequencies that are phase locked with each other, the method comprising:
with a first tunable laser, generating a first laser beam at a first frequency;
generating an RF reference signal having an RF frequency;
splitting the first laser beam and to provide corresponding first and second split beams;
transmitting along a first optical path the first split beam as the first output optical beam;
transmitting the second split beam along a second optical path to generate the second output optical beam, generating the second output optical beam comprising:
modulating the second split beam in response to the RF reference signal to form a modulated beam having a first sideband;
filtering the modulated beam to provide a filtered optical beam; and
using the filtered optical beam as a seed for a second seed injected laser, generating a second laser beam at the second frequency, the second frequency falling within a passband of the optical filter and being offset from the first frequency by an integer multiple of the RF frequency.

* * * * *